(12) United States Patent
Yanagisawa et al.

(10) Patent No.: US 12,142,547 B2
(45) Date of Patent: Nov. 12, 2024

(54) SEMICONDUCTOR DEVICE

(71) Applicant: SONY SEMICONDUCTOR SOLUTIONS CORPORATION, Kanagawa (JP)

(72) Inventors: Yuki Yanagisawa, Kanagawa (JP); Yushi Koriyama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 373 days.

(21) Appl. No.: 17/620,108

(22) PCT Filed: Apr. 1, 2020

(86) PCT No.: PCT/JP2020/014998
§ 371 (c)(1),
(2) Date: Dec. 16, 2021

(87) PCT Pub. No.: WO2020/261692
PCT Pub. Date: Dec. 30, 2020

(65) Prior Publication Data
US 2022/0270954 A1    Aug. 25, 2022

(30) Foreign Application Priority Data
Jun. 26, 2019  (JP) ................. 2019-118115

(51) Int. Cl.
*H01L 29/40*  (2006.01)
*H01L 23/48*  (2006.01)
(Continued)

(52) U.S. Cl.
CPC ........ *H01L 23/485* (2013.01); *H01L 23/4825* (2013.01)

(58) Field of Classification Search
CPC ............... H01L 23/485; H01L 23/4825; H01L 29/41758; H01L 23/4824
(Continued)

(56) References Cited

U.S. PATENT DOCUMENTS

| | | | | |
|---|---|---|---|---|
| 4,949,139 A | * | 8/1990 | Korsh | .............. H03K 19/00361 327/391 |
| 2012/0326235 A1 | | 12/2012 | Otsuru et al. | |
| 2013/0082281 A1 | * | 4/2013 | LaRoche | ................. H01L 21/84 257/77 |

FOREIGN PATENT DOCUMENTS

| | | |
|---|---|---|
| CN | 102842576 A | 12/2012 |
| JP | 2011-199112 A | 10/2011 |

(Continued)

OTHER PUBLICATIONS

International Search Report and Written Opinion of PCT Application No. PCT/JP2020/014998, issued on Jun. 30, 2020, 08 pages of ISRWO.

*Primary Examiner* — Theresa T Doan
(74) *Attorney, Agent, or Firm* — CHIP LAW GROUP

(57) ABSTRACT

There is provided a semiconductor device including a multi-gate transistor having a plurality of gates in a common active region, in which the multi-gate transistor has a comb-shaped metal structure in which a first metal is drawn out and bundled in a W length direction from contacts arranged in a single row in each of a source region and a drain region, and the multi-gate transistor has a wiring layout in which a root section of the first metal coincides immediately above an end of the source region and the drain region or is disposed inside the end of the source region and the drain region in the W length direction.

10 Claims, 14 Drawing Sheets

(51) Int. Cl.
*H01L 23/482* (2006.01)
*H01L 23/485* (2006.01)
*H01L 23/52* (2006.01)

(58) Field of Classification Search
USPC .......................................................... 257/773
See application file for complete search history.

(56) References Cited

FOREIGN PATENT DOCUMENTS

| | | |
|---|---|---|
| JP | 2013-008715 A | 1/2013 |
| TW | 201308565 A | 2/2013 |

\* cited by examiner

1MT ROOT    S/D EDGE        S/D EDGE    1MT ROOT

1MT ROOT    S/D EDGE

S/D EDGE 1MT ROOT

SEMICONDUCTOR DEVICE

CROSS REFERENCE TO RELATED APPLICATIONS

This application is a U.S. National Phase of International Patent Application No. PCT/JP2020/014998 filed Apr. 1, 2020, which claims priority benefit of Japanese Patent Application No. JP 2019-118115 filed in the Japan Patent Office on Jun. 26, 2019. Each of the above-referenced applications is hereby incorporated herein by reference in its entirety.

TECHNICAL FIELD

The present technology relates to a semiconductor device suitable for, for example, a switch element of a high-frequency device.

BACKGROUND ART

A communication terminal includes a device called an antenna switch that switches signals between a reception side and a transmission side, for example. In recent years, with an increase in the number of bands, the number of signal paths in a circuit has increased and has become complex, and a demand for a smartphone supporting it is increasing. Under such circumstances, a semiconductor switch that is small in size and capable of performing high-speed operation is used as an antenna to be mounted.

An important characteristic of such a semiconductor switch is reduction in loss of high-frequency waves passing therethrough. For that purpose, it is important to reduce resistance of a field effect transistor (FET, hereinafter referred to as transistor as appropriate) in an ON state (ON resistance, hereinafter referred to as Ron as appropriate) or capacitance of the transistor in an OFF state (OFF capacitance, hereinafter referred to as Coff as appropriate), that is, to reduce the product (Ron*Coff) of the ON resistance and the OFF capacitance.

Conventionally, a semiconductor switch using a compound has been widely used in view of a merit in performance, but in recent years, a switch using a silicon on insulator (SOI) substrate has emerged in view of a balance between cost and performance. In SOI switches, optimization of an impurity profile and improvement of electron mobility based on tensile stress application to a channel (e.g., see Patent Document 1) have been performed to reduce Ron, and thinning of top Si has been performed to reduce Coff.

Components of the ON resistance Ron of the switching transistor include channel resistance, wiring resistance, and contact resistance, and the channel resistance accounts for a large proportion. When the channel resistance decreases, parasitic components of the wiring cannot be ignored. In recent years, how to reduce the wiring resistance (hereinafter referred to as Rwire as appropriate) and the wiring capacitance (hereinafter referred to as Cwire as appropriate) has become important.

CITATION LIST

Patent Document

Patent Document 1: Japanese Patent Application Laid-Open No. 2011-199112

SUMMARY OF THE INVENTION

Problems to be Solved by the Invention

In a case of an antenna switch, the total width length of a transistor is often designed to be 1 mm or more to reduce Ron, and there are several tens of gates, whereby Rwire of a routing unit inevitably increases. Furthermore, in a conventional wiring layout, resistance and capacitance are basically in a trade-off relationship, whereby it is difficult to reduce both of them. In view of the above, the improvement effect is poor in terms of (Ron*Coff). The coupling capacitance is remarkable in a configuration of connecting from immediately above an element to a bump to avoid routing of the wiring, such as a power transistor. Furthermore, in order to reduce the resistance in the height direction, it is necessary to take measures such as arranging a plurality of contacts in one element and increasing a contact diameter, whereby it cannot be adopted to a transistor for an antenna switch, which is required to be downsized in an element size.

In view of the above, the present technology aims to provide a semiconductor device capable of solving those problems.

Solutions to Problems

The present technology is directed to a semiconductor device including a multi-gate transistor having a plurality of gates in a common active region, in which the multi-gate transistor has a comb-shaped metal structure in which a first metal is drawn out and bundled in a W length direction from contacts arranged in a single row in each of a source region and a drain region, and the multi-gate transistor has a wiring layout in which a root section of the first metal coincides immediately above an end of the source region and the drain region or is disposed inside the end of the source region and the drain region in the W length direction.

Effects of the Invention

According to at least one embodiment, the product of ON resistance and OFF capacitance can be made smaller than that of a conventional device. Note that the effects described herein are not necessarily limited, and may be any of the effects described in the present technology or may be an effect different therefrom. Furthermore, the contents of the present technology are not to be construed as being limited by the effects exemplified in the following descriptions.

MODE FOR CARRYING OUT THE INVENTION

Embodiments to be described below are preferred specific examples of the present technology, and various technically preferable limitations are given. However, the scope of the present technology is not limited to those embodiments unless otherwise particularly described in the following descriptions to limit the present technology.

Figure 1:
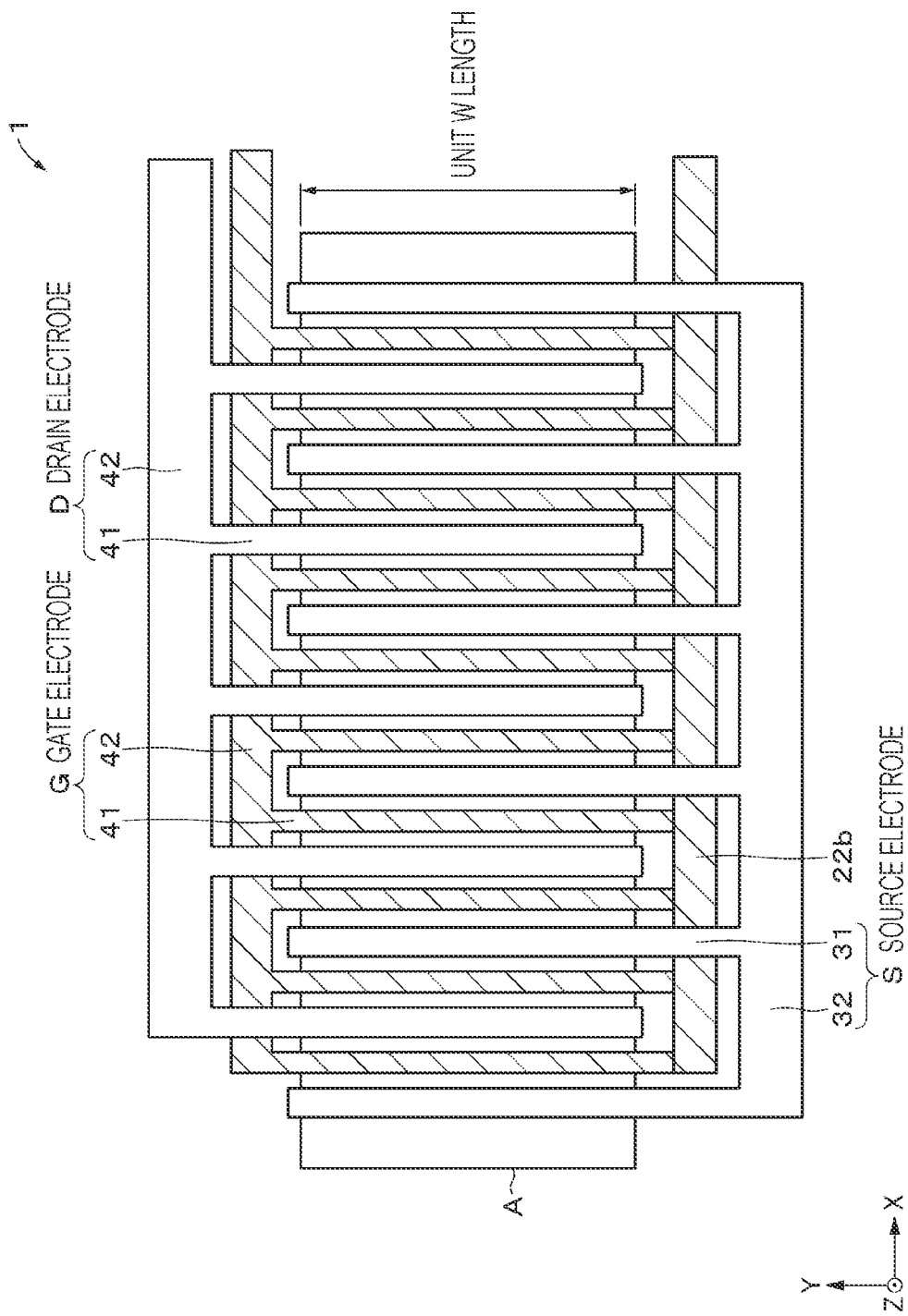
FIG. 1 is a plan view illustrating an exemplary wiring layout of a semiconductor device to which the present technology can be applied.

An exemplary wiring layout of a multi-gate transistor to which the present technology can be applied will be described with reference to FIG. 1. A multi-gate transistor 1 includes a gate electrode G, a source electrode S, and a drain electrode D. The gate electrode G has a comb-teeth shape, and includes a plurality of comb-teeth sections 21 extending in the same direction (e.g., Y direction) and root sections (gate routing wiring) 22a and 22b connecting the plurality of comb-teeth sections 21. In the example of FIG. 1, the comb-teeth section 21 has an H-shaped configuration connected to the facing root sections 22a and 22b. The present technology can also be applied to a T-shaped configuration having a root section only on one side. In FIGS. 2A, 2B, 2C, and 2D, the gate electrode G is illustrated with oblique lines added.

Note that, in the following descriptions and drawings, a longitudinal direction of the comb-teeth section 21 of the gate electrode G is defined as a Y direction, a longitudinal direction of the root sections 22a and 22b is defined as an X direction, and a direction orthogonal to both of the directions (lamination direction) is defined as a Z direction. Furthermore, the Y direction may be referred to as a W length direction, and the X direction may be referred to as an L length direction.

In a similar manner to the gate electrode G, the source electrode S has a comb-teeth shape, and includes comb-teeth sections 31 extending in the same direction (e.g., Y direction) and a root section (source routing wiring) 32 connecting the plurality of comb-teeth sections 31. In a similar manner to the gate electrode G and the source electrode, the drain electrode D has a comb-teeth shape, and includes comb-teeth sections 41 extending in the same direction (e.g., Y direction) and a root section (drain routing wiring) 42 connecting the plurality of comb-teeth sections 41.

The comb-teeth section 31 of the source electrode S and the comb-teeth section 41 of the drain electrode D are alternately disposed in the gap between the comb-teeth sections 21 of the gate electrode G. The comb-teeth section 21 of the gate electrode G, the comb-teeth section 31 of the source electrode S, and the comb-teeth section 41 of the drain electrode D are disposed inside an active region (active zone) A. The root section 22 of the gate electrode G, the root section 32 of the source electrode S, and the root section 42 of the drain electrode D are disposed in an element isolation region outside the active region A. A length of the active region A in the Y direction is referred to as a unit W length.

A first metal (hereinafter referred to as 1MT) includes a source electrode S and a drain electrode D. The first metal M1 has a thickness of, for example, 500 nm to 1000 nm, and includes aluminum (Al). The source electrode S is connected to a source region of a semiconductor layer through a contact extending in the Z direction, and the drain electrode D is connected to the source region of the semiconductor layer through a contact extending in the Z direction. The contact includes, for example, tungsten (W).

The wiring layout of FIG. 1 is an example in which the number of multi-gates is 10. Although the number of multi-gates is not limited to 10 in the present technology, it is preferably 10 or more from the viewpoint of effects. Furthermore, at least one contact of the source/drain region exists on a front face in the L length direction across the gate.

Figure 2A:
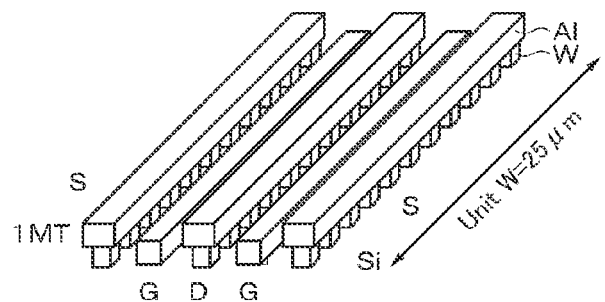
FIGS. 2A, 2B, 2C, and 2D are perspective views illustrating examples of conventional wiring layouts.

Some examples of a wiring layout of a conventional multi-gate transistor will be described with reference to FIGS. 2A, 2B, 2C, and 2D. FIG. 2A is an example of using only MT1 for extracting/routing the source/drain of the transistor. In FIGS. 2A, 2B, 2C, and 2D, G represents a gate electrode, D represents a drain electrode, and S represents a source electrode. Furthermore, Al represents aluminum that is a material of 1MT, a second metal (denoted by 2MT), or a third metal (denoted by 3MT), and W represents tungsten that is a material of a contact.

Figure 2B:
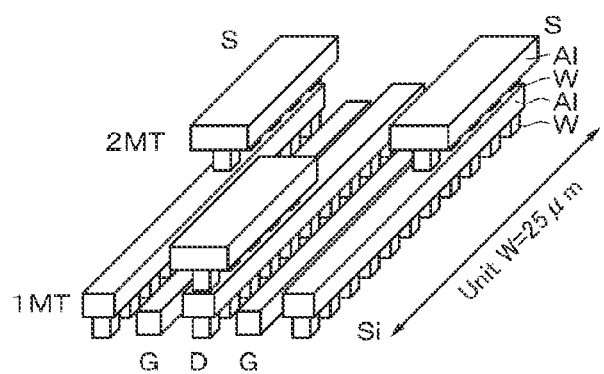

In order to reduce Rwire, a wiring layout (2MT half stack) in which 2MT is disposed immediately above 1MT is used as illustrated in FIG. 2B. In order to prevent an excessive increase in Cwire, MT2 is made to exist only up to half of MT1 in the unit width direction, and the facing area between 1MT and 2MT is reduced.

Figure 2C:
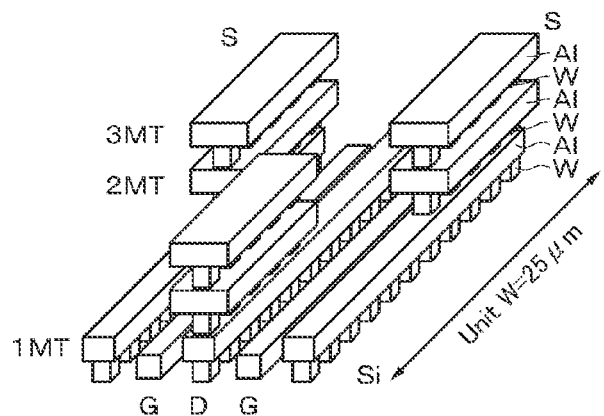
Figure 2D:
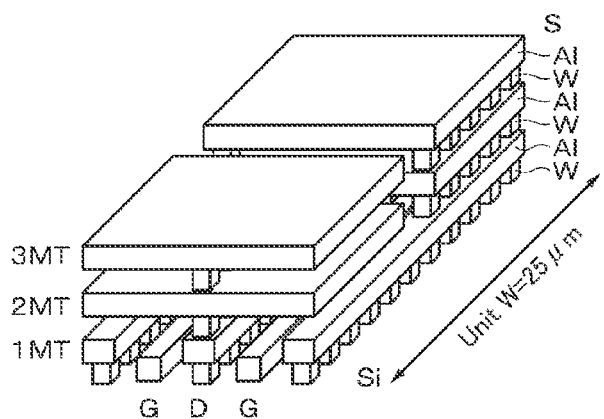

Moreover, a wiring layout (3MT half stack) in which 3MT is disposed immediately above 2MT is used as illustrated in FIG. 2C. Furthermore, in order to reduce Rwire, a wiring layout (2MT/3MT short) in which adjacent drain electrodes and adjacent source electrodes are short-circuited is used as illustrated in FIG. 2D.

The present technology can be applied to any of the wiring layouts of only 1MT, 2MT half stack, 3MT half stack, and 2MT/3MT short described above. However, since it is difficult to reduce Rwire only with 1MT, it is preferable that an upper layer metal of 1MT or more overlaps immediately above the root section of 1MT.

The present technology relates to a transistor for switch use, and has a wiring layout different from that of a transistor for power system use. That is, in the case of the power transistor, routing is avoided to the utmost to reduce Rwire. That is, a special configuration is taken in which the source/drain is stacked immediately above a silicon chip, taken out, and directly connected to a bump.

In an antenna switch to which the present technology is applied, for example, the total W length of the transistor is often designed to be 1 mm or more to reduce Ron, and there are several tens of gates, whereby Rwire of a routing unit inevitably increases. Furthermore, the source/drain metal has to be in a half-stack shape as resistance and capacitance are basically in a trade-off relationship, and it is difficult to reduce both characteristics. In view of the above, there has been a problem that the improvement effect is poor in terms of (Ron×Coff).

Figure 3:
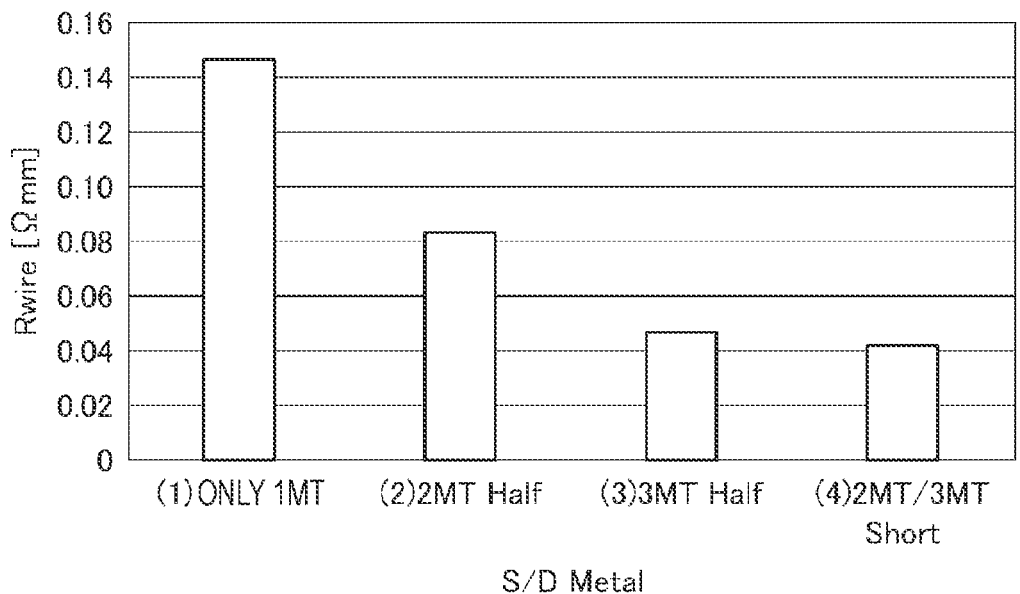
FIG. 3 is a graph showing Rwire values for the respective conventional wiring layouts.
Figure 4:
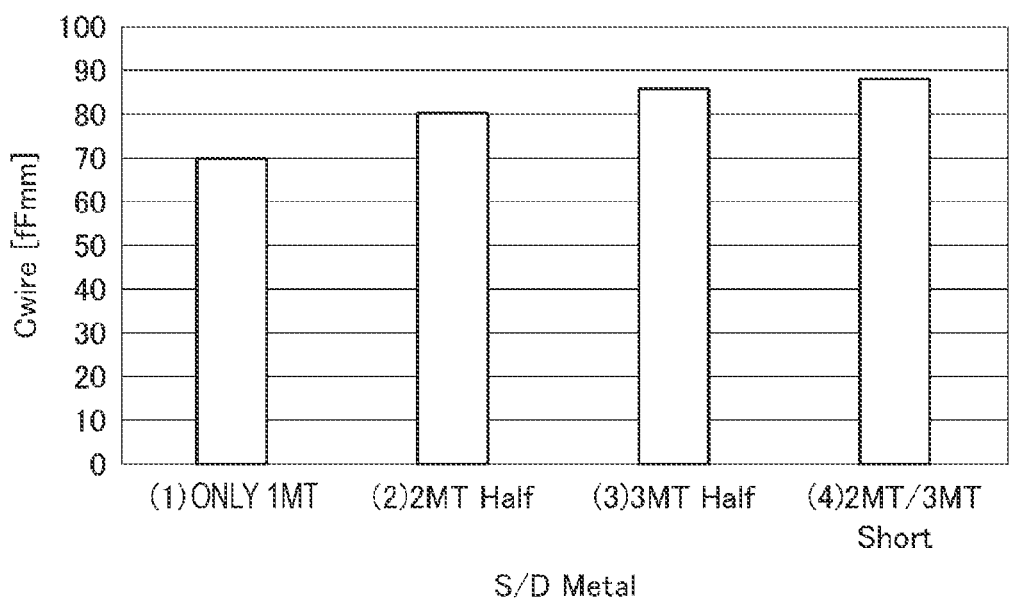
FIG. 4 is a graph showing Cwire values for the respective conventional wiring layouts.

FIGS. 3 and 4 show results of calculation of Rwire and Cwire of the respective conventional wiring layouts as illustrated in FIGS. 2A, 2B, 2C, and 2D on the basis of electromagnetic field simulation. FIG. 3 shows each wiring layout dependency of Rwire, and FIG. 4 shows each wiring layout dependency of Cwire. The simulation was carried out with a unit W length of 25 µm and the number of comb teeth of 40.

Respective simulation results of the wiring layout of only 1MT (FIG. 2A), 2MT half stack (FIG. 2B), 3MT half stack (FIG. 2C), and 2MT/3MT short (FIG. 2D) are shown in order. As illustrated in FIG. 3, Rwire decreases in accordance with the change of the wiring layout as described above. In contrast, as illustrated in FIG. 4, Cwire increases in accordance with the change of the wiring layout as described above. Therefore, there has been a problem with the conventional wiring layout that the effect of reducing (Ron×Coff) is small.

The coupling capacitance is remarkable in the configuration of connecting from immediately above the element to the bump to avoid routing of the wiring, such as the power transistor described above. Furthermore, in order to reduce the resistance in the height direction, it is necessary to take measures such as arranging a plurality of contacts in one element and increasing a contact diameter, whereby it is difficult to adopt the configuration to a field-effect transistor for an antenna switch, which is required to be downsized in an element size.

Figure 5:
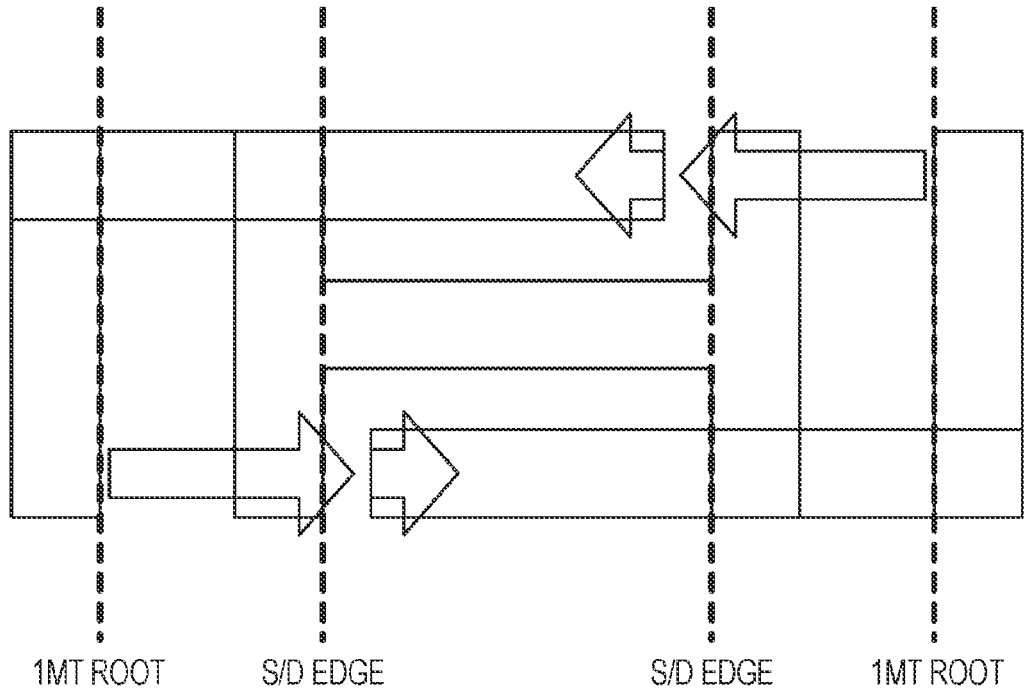
FIG. 5 is a schematic diagram to be used to explain the present technology.
Figure 6:
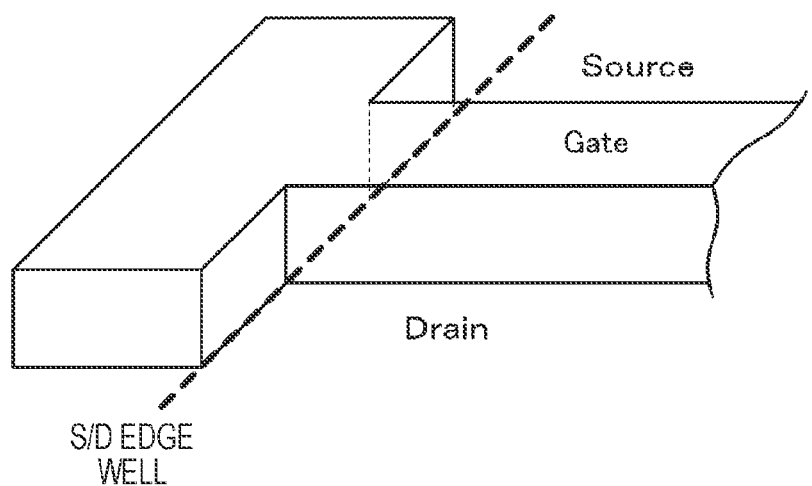
FIG. 6 is a perspective view to be used to explain the present technology.

The present technology aims to solve such a problem. According to the present technology, in a wiring layout of a multi-gate switch transistor (in a case of having one comb-teeth section for simplicity), an end of a root section (coupling portion) of a comb-shaped 1MT in which each of a source/drain is drawn out in a W length direction and bundled is disposed immediately above and in front (matching position) of an end of a source/drain region in the W length direction as indicated by arrows in FIG. 5. In FIG. 6, the end of the source/drain region is indicated by a broken line. Alternatively, the end of the root section (coupling portion) is disposed inside the end of the source/drain region in the W length direction. At this time, the opposing 1MT is retracted toward the center in the W length direction, and the contact (denoted by ICON) at the end is thinned out by the approach width (by unit W length). As an example, the distance of 1MT in the W length direction facing the end of the root section disposed inside is set in a range of 0.1 µm to 0.8 µm. With this arrangement, the metal of the root section of 1MT where the current is most concentrated becomes thicker, whereby it becomes possible to reduce Rwire and to reduce Cwire with the area of the facing metal of the source/drain decreased.

In the present technology, the overall size and withstand voltage of the field-effect transistor do not change before and after application. As the approach width increases, Coff tends to monotonically decrease, and the effective W length of the field-effect transistor decreases (actual operation region narrows), whereby the increase tendency and behavior of Ron change from a certain point. That is, an optimum approach width of the 1MT root section is set depending on the unit W length.

Moreover, an exemplary wiring layout will be described. In a multi-gate transistor in which a diffusion layer is shared and connected with adjacencies such as (drain→gate-→source→gate→drain), for example, the drain and source have a comb shape in which 1MT is drawn out and bundled in opposite directions in the W length direction. In the same way, the gate electrode is drawn out in the W length direction and bundled on one side. The configuration of being bundled on one side is referred to as a T-shape. The configuration of bundling the gate electrodes on both sides as illustrated in FIG. 1 is referred to as an H-shape.

Here, the metal material is Al or Cu, the film thickness of 1MT is in the range of 200 to 1000 nm, the width of 1MT is in the range of 200 to 700 nm, the height of ICON is in the range of 300 to 1100 nm, the diameter of ICON is in the range of 100 to 500 nm, the thickness of the gate electrode is in the range of 50 to 300 nm, and the gate length is in the range of 10 to 500 nm. Note that not only polycrystalline silicon but also a metal material such as TiN, TiAlN, TaN, or TaC may be used for the gate.

Figure 7:
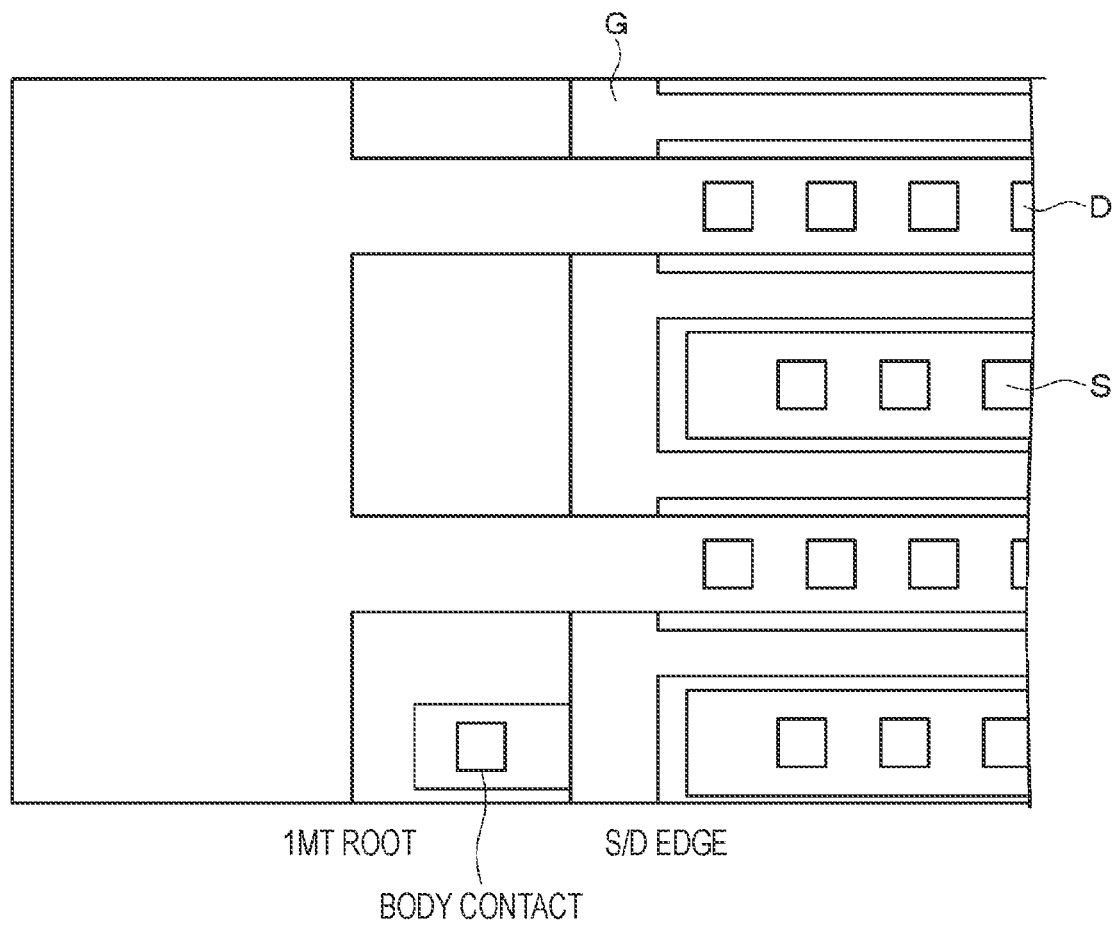
FIG. 7 is a plan view for explaining a conventional wiring layout.
Figure 8:
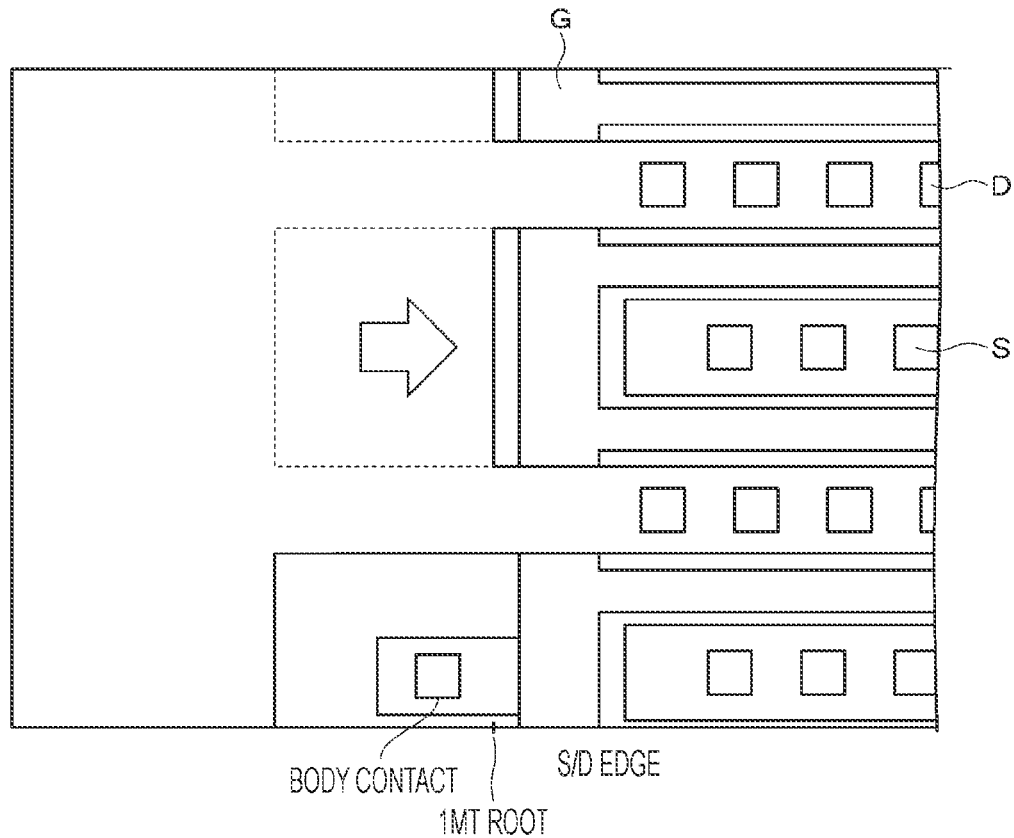
FIG. 8 is a plan view for explaining a wiring layout of a reference example.
Figure 9:
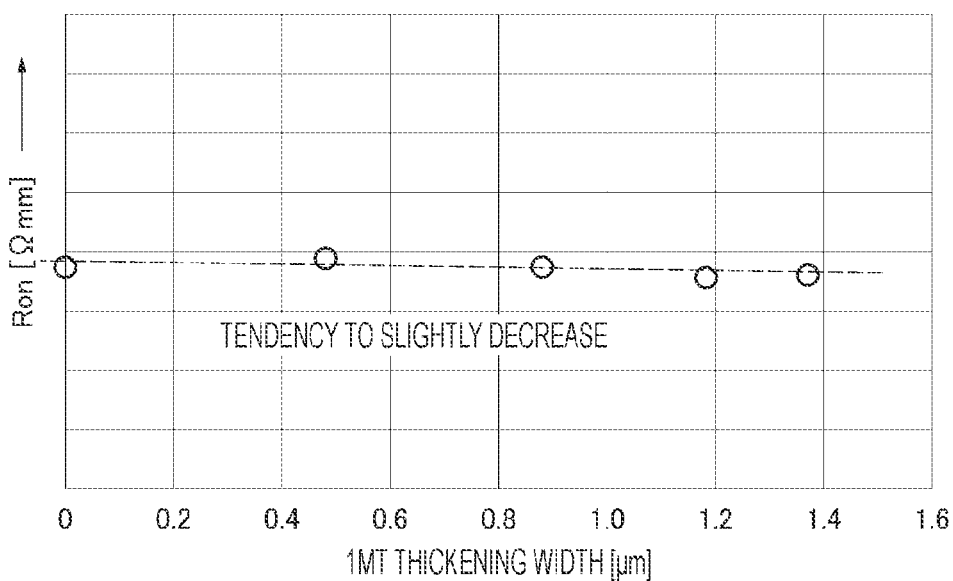
FIG. 9 is a graph showing a change in Ron with respect to a thickening width of a root section according to the reference example.
Figure 10:
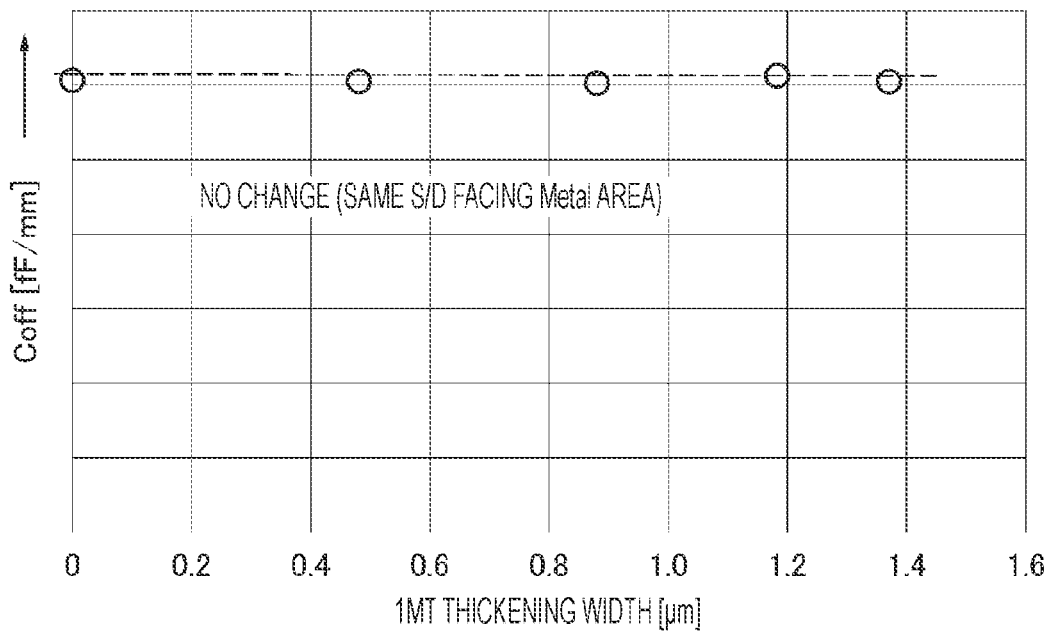
FIG. 10 is a graph showing a change in Coff with respect to the thickening width of the root section according to the reference example.

A body contact is normally disposed between the bundled gate and the 1MT root section of the bundled drain or source. While 1MT of the body contact is disposed in parallel with 1MT of the gate, drain, or source as a multi-contact in many cases, in the conventional configuration of FIG. 7, it is disposed alone. From this state, the 1MT root section of the source/drain is thickened to the vicinity of the gate electrode as illustrated in FIG. 8. This wiring layout is a reference example, and the actual measurement result of Ron in the reference example is shown in FIG. 9 (example with a unit length of 25 µm and a total W length of 1 mm). Furthermore, the actual measurement result of Coff in the reference example is shown in FIG. 10.

Figure 11:
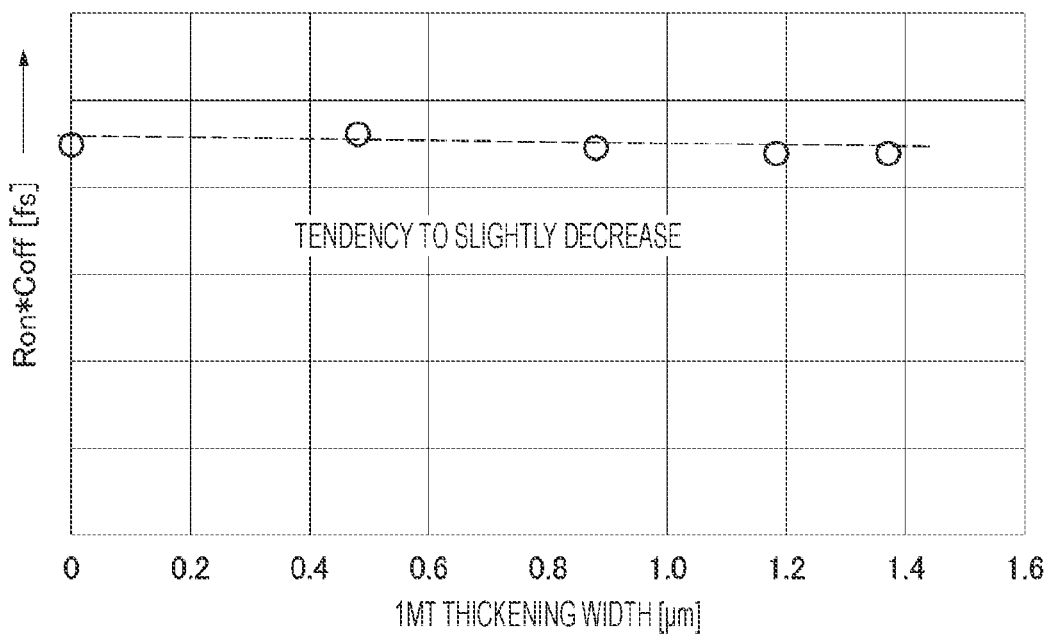
FIG. 11 is a graph showing a change in (Ron×Coff) with respect to the thickening width of the root section according to the reference example.
Figure 12:
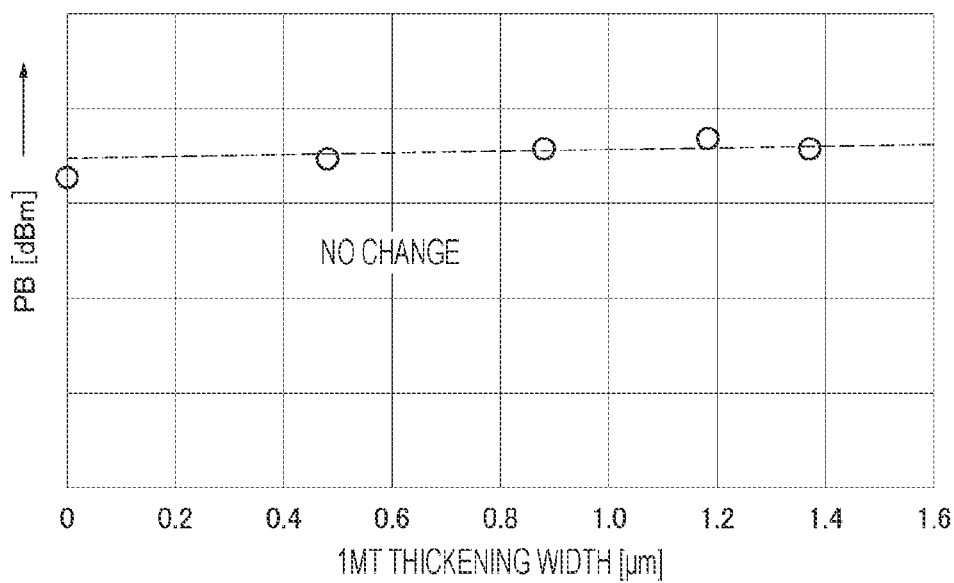
FIG. 12 is a graph showing a change in PB with respect to the thickening width of the root section according to the reference example.

FIG. 9 is a graph showing a relationship between the thickening width (horizontal axis) of the 1MT root section and Ron (vertical axis). It can be seen that Rwire decreases as the thickening width increases, whereby Ron slightly decreases. FIG. 10 is a graph showing a relationship between the thickening width (horizontal axis) of the 1MT root section and Coff (vertical axis). FIG. 11 is a graph showing a relationship between the thickening width (horizontal axis) of the 1MT root section and (Ron×Coff) (vertical axis). FIG. 12 is a graph showing a relationship between the thickening width (horizontal axis) of the 1MT root section and power break (PB: factor correlated with withstand voltage) (vertical axis). As can be seen from FIGS. 11 and 12, Coff and PB hardly change even when the thickening width increases.

As a result of the slight decrease in Rwire, (Ron×Coff) also slightly decreases. As described above, although characteristics are improved by the wiring layout changed from the conventional configuration (FIG. 7) as illustrated in FIG. 8, the effect is as small as −1 fs ($10^{-15}$).

Figure 13:
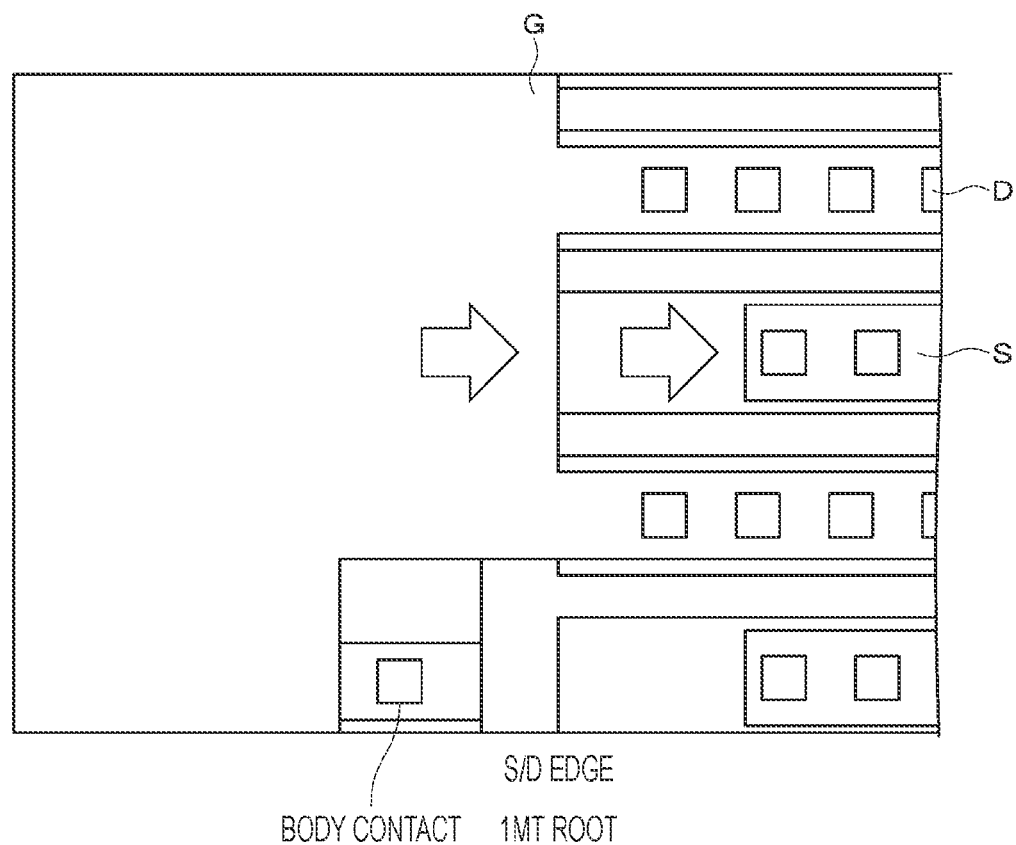
FIG. 13 is a plan view illustrating a wiring layout according to a first embodiment of the present technology.
Figure 14:
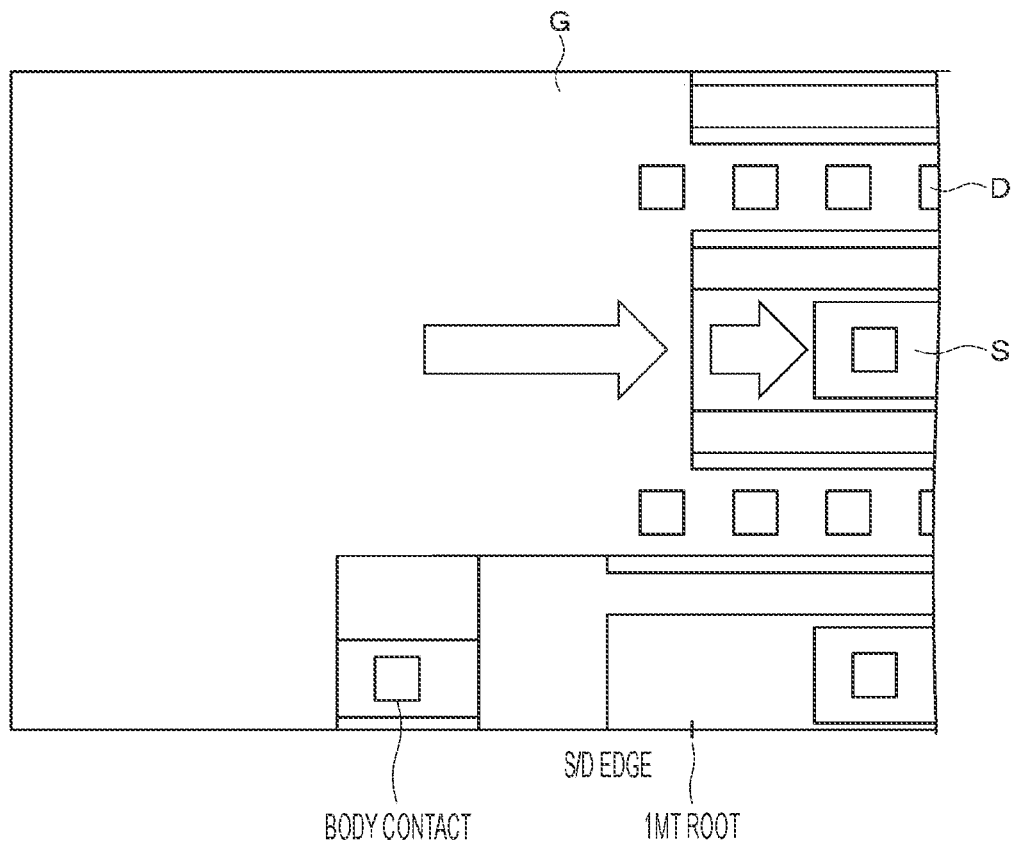
FIG. 14 is a plan view illustrating a wiring layout according to a second embodiment of the present technology.

As illustrated in FIG. 13, the first embodiment of the present technology is a wiring layout in which the end of the 1MT root section of the source/drain is thickened until it comes in front of (to a position matching the position immediately above the end) immediately above the end of the source/drain region in the W length direction. Furthermore, as illustrated in FIG. 14, the second embodiment of the present technology is a wiring layout in which the end of the 1MT root section of the source/drain is thickened until it comes the inner side of the end of the source/drain region in the W length direction. In any of the embodiments, the opposing 1MT (source electrode in the case of thickening the root section of drain 1MT, and drain electrode in the case of thickening the root section of source 1MT) at this time is retracted toward the center in the W length direction, and the contact at the end is removed. The distance between the 1MT root section and the opposing 1MT is set to 0.2 µm to 1.0 µm, and the maximum number of contacts that can be placed between them is disposed.

Figure 15:
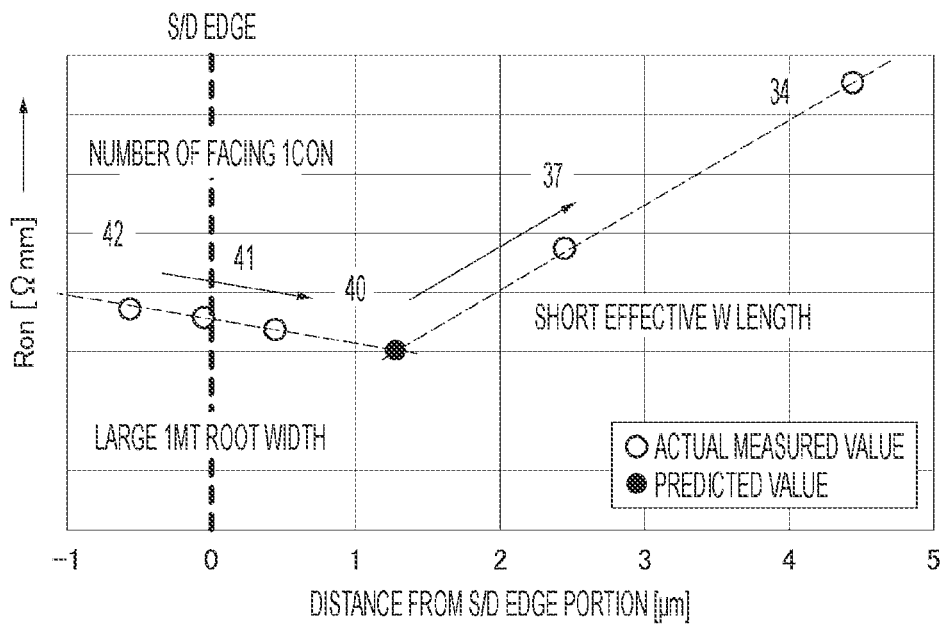
FIG. 15 is a graph showing a change in Ron with respect to a change in distance from an S/D edge of a 1MT root section according to the first and second embodiments of the present technology.
Figure 16:
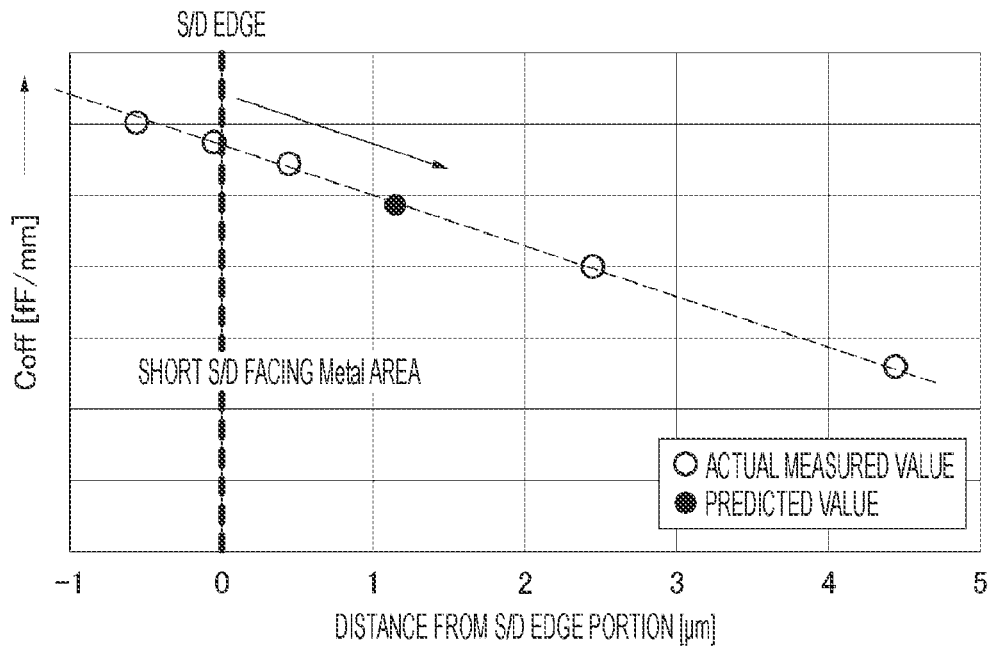
FIG. 16 is a graph showing a change in Coff with respect to a change in distance from the S/D edge of the 1MT root section according to the first and second embodiments of the present technology.
Figure 17:
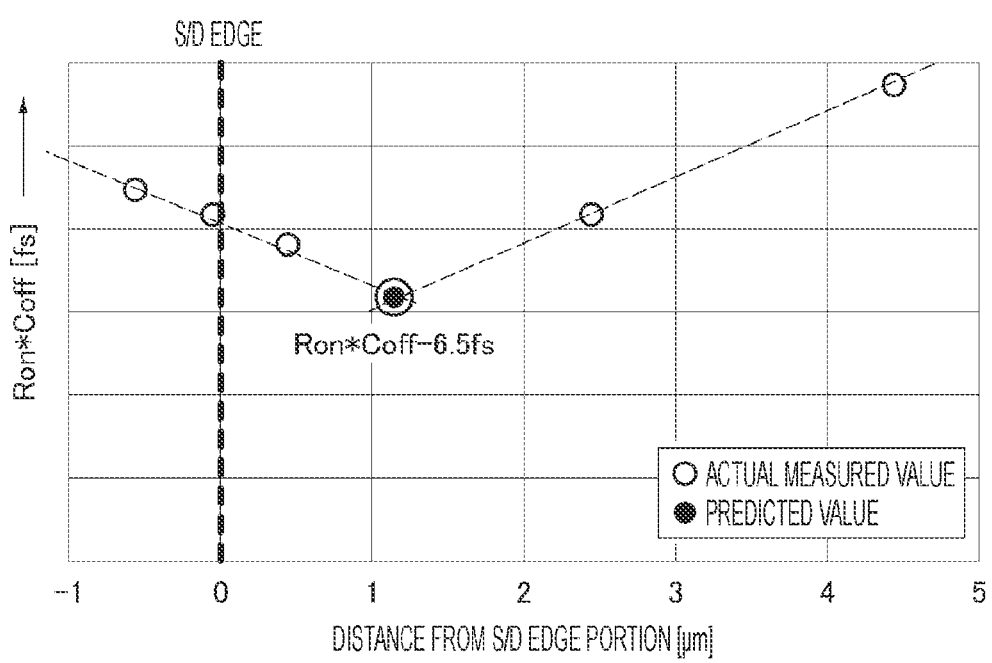
FIG. 17 is a graph showing a change in (Ron×Coff) with respect to a change in distance from the S/D edge of the 1MT root section according to the first and second embodiments of the present technology.
Figure 18:
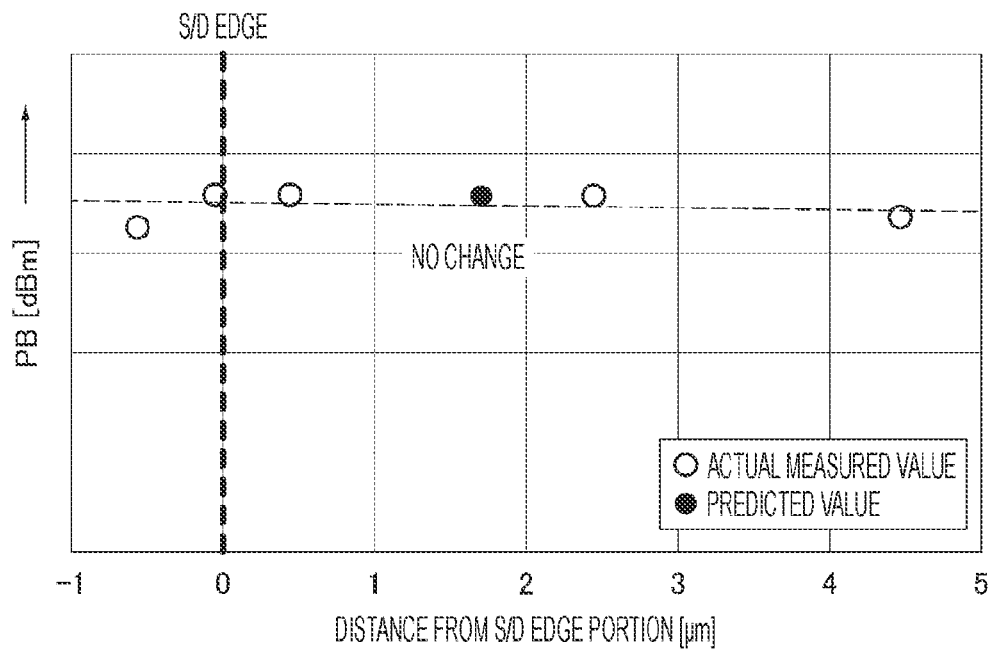
FIG. 18 is a graph showing a change in PB with respect to a change in distance from the S/D edge of the 1MT root section according to the first and second embodiments of the present technology.

In relation to the first embodiment and the second embodiment, an actual measurement result of Ron is shown in FIG. 15, an actual measurement result of Coff is shown in FIG. 16, an actual measurement result of (Ron×Coff) is shown in FIG. 17, and an actual measurement result of PB is shown in FIG. 18. Those data are data in the case of, for example, a unit length of 25 µm and a total W length of 1 mm.

FIG. 15 is a graph showing a relationship between a distance of the source/drain region of the end of the root section from the end in the W length direction (horizontal axis) and Ron (vertical axis). It can be seen that, as compared with the case of FIG. 9, Ron decreases when being positioned immediately above the end of the source/drain region (distance is 0), and Ron further decreases when being positioned inside of the end of the source/drain region. This is considered to be due to the fact that the operation is not completely uniform as viewed in the entire W length of the transistor, and there is a region where the original capability of the transistor is not fully exhibited at the end of the source/drain region. In this region, the total Ron can be reduced by thickening the 1MT wiring and reducing Rwire.

Furthermore, Ron tends to increase when it is positioned inside a certain point (in the case of the unit length=25 µm, the end of the 1MT root section is positioned on the inner side of the end of the source/drain region by 1.2 µm) set as a boundary. This is because the effective W length (actual operation region) of the transistor becomes shorter to enter a region where an adverse effect is exerted with respect to Ron.

FIG. 16 is a graph showing a relationship between the position of the end of the 1MT root section and Coff. As shown in FIG. 16, Coff decreases more uniformly as it comes closer to the center in the W length direction. This is because the area of 1MT facing the source/drain decreases.

FIG. 17 is a graph showing a relationship between a distance between the end of the root section and the end of the source/drain region in the W length direction (horizontal axis) and (Ron×Coff) (vertical axis). (Ron×Coff) has a tendency similar to Ron, and the decrease range at the optimum point is 6.5 fs from the case of the wiring layout in which the 1MT root section is thickened (FIG. 8), which is significantly large. Furthermore, FIG. 18 is a graph showing a relationship between a distance from the end of the source/drain region in the W length direction (horizontal axis) and the power break (PB: factor correlated with withstand voltage) (vertical axis). When the distance from the end of the source/drain region is changed, PB does not change. As described above, according to the first and second embodiments of the present technology, it becomes possible to avoid the trade-off between Ron, Coff, and the withstand voltage.

Figure 19:
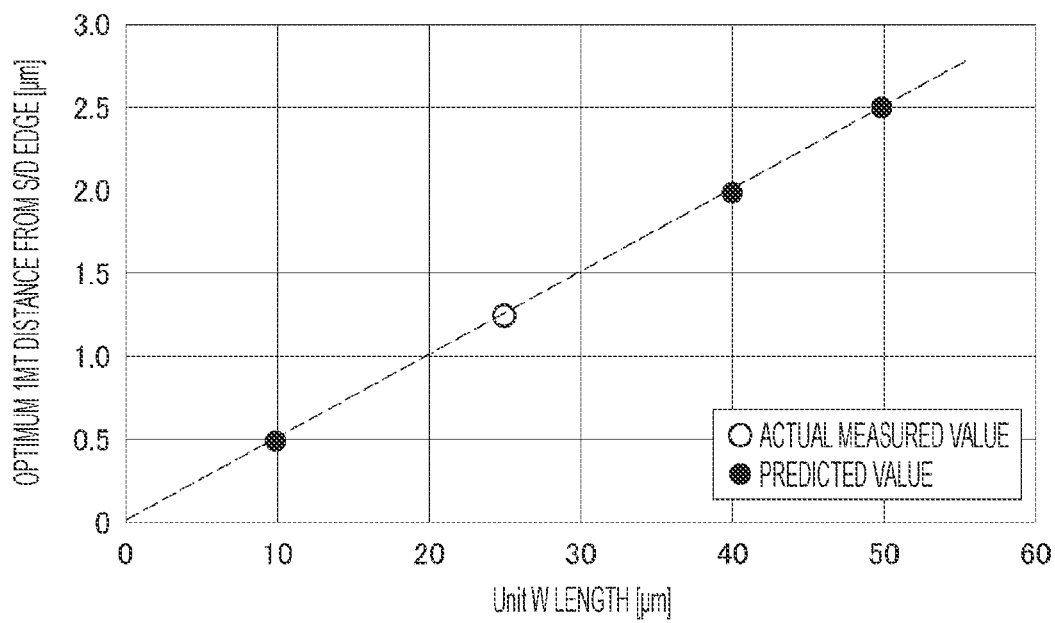
FIG. 19 is a graph showing an optimum value for the distance of the 1MT root section from the S/D edge with respect to a unit W length.

Furthermore, the optimum position of the end of the 1MT root section is considered to be different for each unit length. As shown in FIG. 19, it is predicted that the relationship between the unit W length and the optimum value of the distance from the end of the source/drain region in the W length direction is basically in a proportional relationship. In view of the margin due to a difference in process and design, the optimum position of the 1MT root section seems to exist in a range of the inner side of the end of the source/drain region in the W length direction by (unit W length×0.05+/− unit W length×0.03) µm. For example, in a case of a unit W length of 25 µm, the optimum position of the end of the 1MT root section is in the range of 0.5 to 2.0 µm from the inner side of the end of the source/drain region in the W length direction.

Figure 20A:
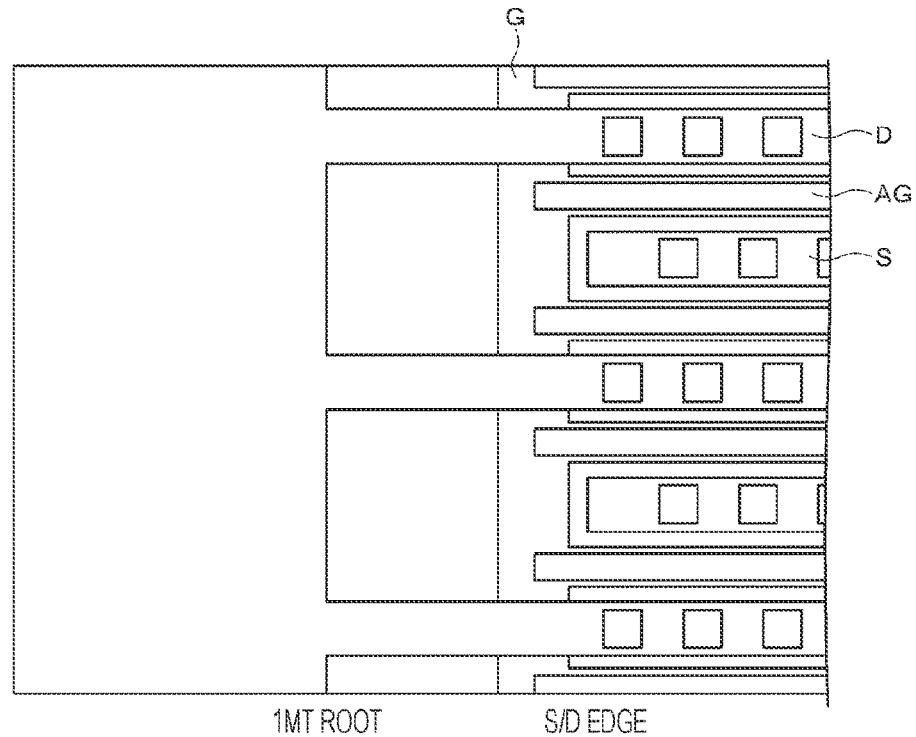
FIGS. 20A and 20B are plan views for explaining a third embodiment in which the present technology is applied to a field-effect transistor having a gap formed.
Figure 20B:
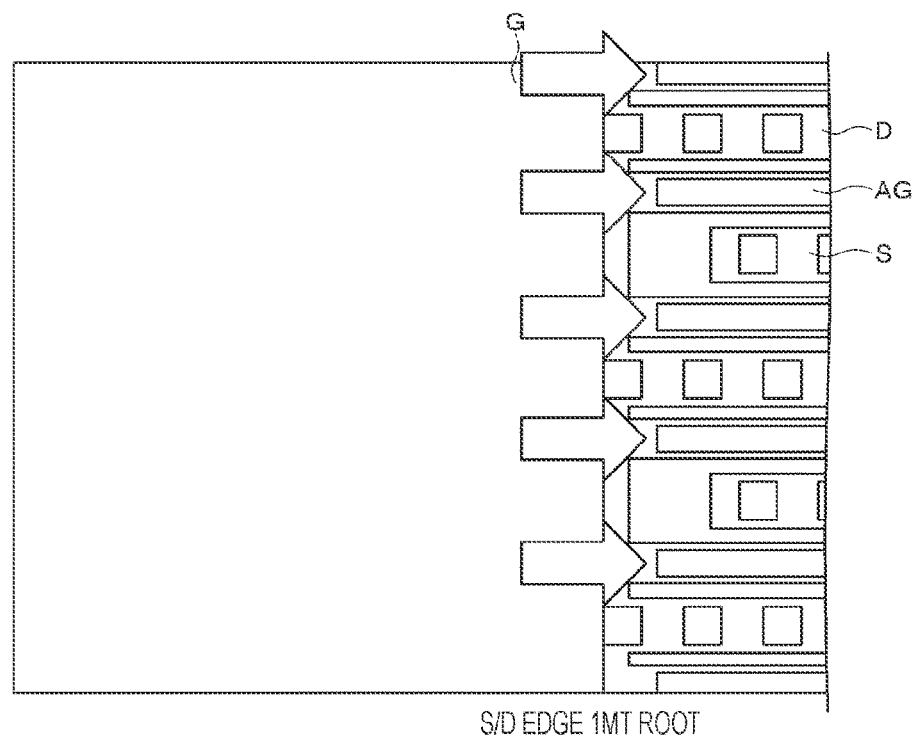

Next, a third embodiment of the present technology will be described. In the third embodiment, the present technology is applied to a field-effect transistor in which a gap (air gap), which is a vacuum area, is formed between opposing metals of a source/drain to reduce capacitance. As illustrated in FIG. 20A, in a normal wiring layout, a gap AG is formed up to the outside of a source/drain region. Meanwhile, in the third embodiment, when an end of a 1MT root section in a W length direction is moved toward the center, the opposing 1MT is retracted, and the gap AG is also retracted in a similar manner as illustrated in FIG. 20B. This is to prevent exposure of the metal to the outside of an interlayer film due to contact between the 1MT root section and the gap AG.

Figure 21:
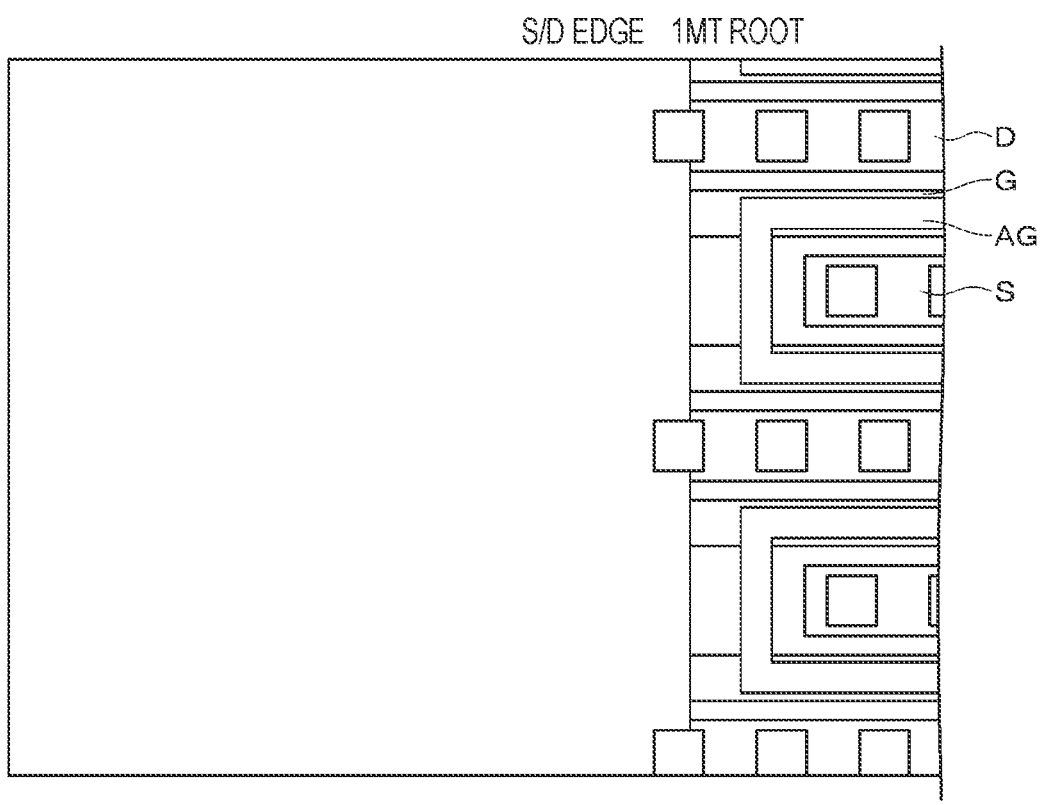
FIG. 21 is a plan view for explaining a fourth embodiment in which the present technology is applied to a field-effect transistor having a gap also formed between an end of a 1MT root section and opposing 1MT.

FIG. 21 illustrates a case where a gap is also formed between an end of a 1MT root section and an opposing 1MT as a fourth embodiment of the present technology. With such a structure, a gap AG is interposed between source/drain metals facing in a W length direction, whereby Cwire can be reduced. The gap AG has a meandering structure.

Figure 22:
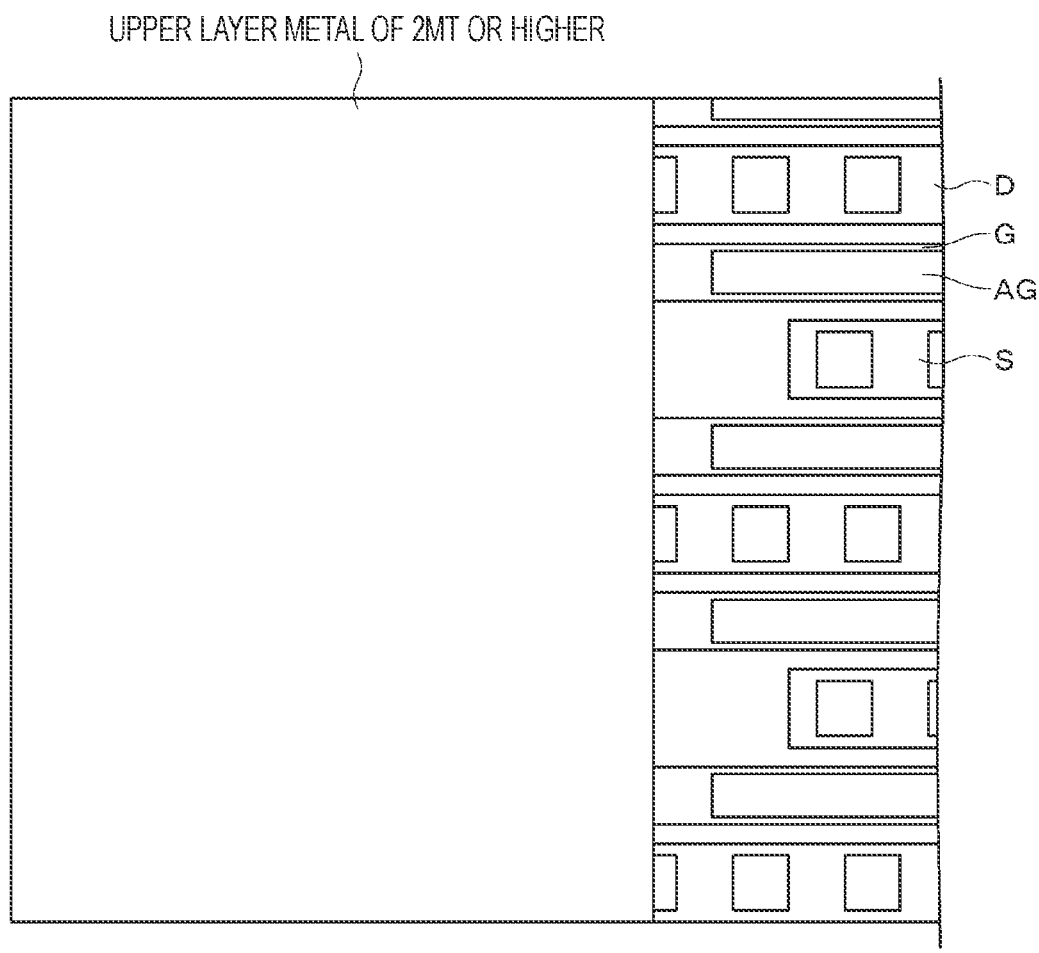
FIG. 22 is a plan view for explaining a fifth embodiment in which the present technology is applied to a wiring layout including an upper layer memory of 2MT or higher.

As illustrated in FIG. 22, in a fifth embodiment of the present technology, the present technology is applied to a wiring layout having an upper layer metal of 2MT or higher. The metal material of 2MT or higher is, for example, Al or Cu, the film thickness of the metal is in the range of 200 to 1000 µm (up to 5000 nm for the case of the uppermost layer), the metal width is in the range of 200 to 700 nm, the material of the contact is W or Cu, the height of the contact is in the range of 300 to 1100 nm, and the contact diameter is in the range of 100 to 500 nm.

Figure 23:
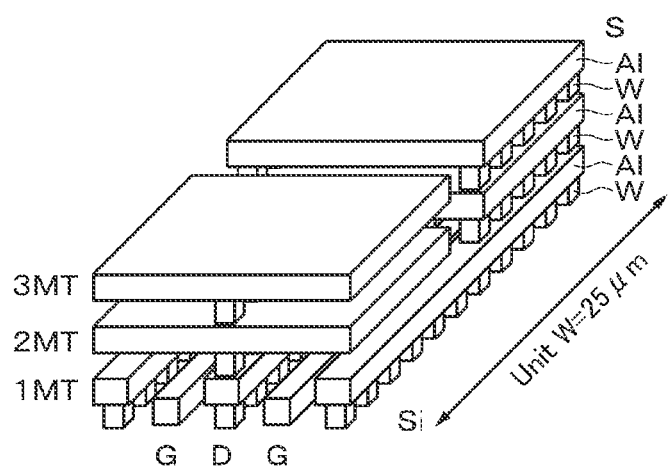
FIG. 23 is a plan view for explaining a sixth embodiment of the present technology.

As illustrated in FIG. 23, in a sixth embodiment of the present technology, an upper layer metal of 2MT or higher covers a root section, and adjacent drain metals and source metals in a half stack configuration are short-circuited immediately above an operation region of a transistor. With such a structure, it becomes possible to further reduce Rwire.

According to the present technology, in a multi-gate transistor, a 1MT root section of a comb shape source/drain becomes thicker while an element size and withstand voltage are maintained, whereby Rwire can be reduced. In addition, an opposing metal is retracted toward the center of the W length, whereby an area of the opposing metal of the source/drain can be reduced, and Cwire can also be reduced. Therefore, it becomes possible to remarkably reduce (Ron×Coff), which is an important index in a high-frequency switch such as an antenna switch.

As an example, in a case where the present technology is applied to a field-effect transistor having a standard unit W length of 25 μm and 40 multi-gates, when a comb-shaped 1MT root section is moved inward by 1.2 μm from the end of a source/drain region in a W length direction, an opposing metal is retracted, and a contact plug of the end is removed, (Ron×Coff) can be reduced by 6 fs or more, and a significantly remarkable effect can be obtained.

Furthermore, withstand voltage and an element size do not change as compared with those before the application of the present technology, and it becomes possible to avoid the trade-off existing between Ron, Coff, the withstand voltage, and the size.

Note that the configurations according to the first to sixth embodiments described above may be applied to both of a drain-side metal and a source-side metal, or may be applied to either one of them.

Furthermore, a wiring layout according to the present technology may be applied to a complementary metal oxide semiconductor (CMOS) circuit. Moreover, the wiring layout according to the present technology may be applied to a display, an image sensor, a semiconductor memory, a high-frequency switch, a power amplifier, and a low noise amplifier.

Although the embodiments of the present technology have been specifically described above, it is not limited to the respective embodiments described above, and various modifications based on the technical idea of the present technology may be made. Furthermore, the configurations, methods, processes, shapes, materials, numerical values, and the like of the embodiments described above may be combined with each other without departing from the gist of the present technology. For example, in the present technology, an operation method and a conductivity type of a transistor are not limited. While the present technology is suitable for antenna switch application as an effect to be obtained is larger as the number of multi-gates is larger, it may also be applied to a field-effect transistor for other application. Moreover, a base substrate may be any of a compound semiconductor such as bulk silicon, silicon on insulator (SOI), GaAs, GaN, or SiC, glass, and sapphire, thereby being excellent in versatility.

Note that the present technology may also employ the following configurations.

(1)

A semiconductor device including a multi-gate transistor having a plurality of gates in a common active region, in which the multi-gate transistor has a comb-shaped metal structure in which a first metal is drawn out and bundled in a W length direction from contacts arranged in a single row in each of a source region and a drain region, and the multi-gate transistor has a wiring layout in which a root section of the first metal coincides immediately above an end of the source region and the drain region or is disposed inside the end of the source region and the drain region in the W length direction.

(2)

The semiconductor device according to (1), in which at least one of the contacts is present on a front face in an L length direction across a gate.

(3)

The semiconductor device according to (1) or (2), in which an upper layer metal of a second metal or higher overlaps immediately above the root section of the first metal.

(4)

The semiconductor device according to any one of (1) to (3), in which the root section of the first metal is disposed in a range of (W length×0.05+unit W length×0.03) (μm) from immediately above (front) the source/drain region toward the inside.

(5)

The semiconductor device according to any one of (1) to (4), in which a distance of a first metal facing the root section of the first metal in the W length direction is in a range of 0.1 μm to 0.8 μm.

(6)

The semiconductor device according to any one of (1) to (4), in which a contact that connects a first metal facing the root section of the first metal and a substrate is not disposed in a range of (unit W length×0.05−unit W length×0.03) (μm) from immediately above the source/drain region.

(7)

A semiconductor device including a transistor, in which both of a drain-side metal and a source-side metal of the transistor have the wiring layout according to any one of (1) to (6).

(8)

A semiconductor device including a transistor, in which one of a drain-side metal or a source-side metal of the transistor has the wiring layout according to any one of (1) to (6).

(9)

The semiconductor device according to any one of (1) to (8), in which the number of multi-gates of the transistor is 10 or more.

(10)

The semiconductor device according to any one of (1) to (9), in which an SOI substrate is used for the transistor.

(11)

The semiconductor device according to any one of (1) to (9), in which a compound semiconductor is used for the transistor.

REFERENCE SIGNS LIST

1 Transistor
G Gate electrode
21 Root section of gate electrode
22a, 22b Comb-teeth section of gate electrode
D Drain electrode
31 Root section of drain electrode
32 Comb-teeth section of drain electrode
S Source electrode
41 Root section of source electrode
42 Comb-teeth section of source electrode
A Active region
AG Gap

The invention claimed is:
1. A semiconductor device, comprising:
a multi-gate transistor having a plurality of gates in a common active region, wherein
the multi-gate transistor further comprises:

a comb-shaped metal structure in which a first metal is drawn out and bundled in a W length direction from contacts arranged in a single row in each of a source region and a drain region; and an upper layer metal of a second metal that overlaps immediately above a root section of the first metal, and the multi-gate transistor includes a wiring layout in which the root section of the first metal coincides immediately above an end of the source region and the drain region or the root section of the first metal is inside the end of the source region and the drain region in the W length direction.

2. The semiconductor device according to claim 1, wherein at least one of the contacts is present on a front face in an L length direction across a gate.

3. The semiconductor device according to claim 1, wherein the root section of the first metal is in a range of (W length×0.05+unit W length×0.03)(μm) from immediately above the source region or the drain region toward inside.

4. The semiconductor device according to claim 1, wherein a distance of a third metal facing the root section of the first metal in the W length direction is in a range of 0.1 μm to 0.8 μm.

5. The semiconductor device according to claim 1, wherein a contact that connects a third metal facing the root section of the first metal and a substrate is not in a range of (unit W length×0.05−unit W length×0.03)(μm) from immediately above the source region or the drain region.

6. A semiconductor device, comprising:
a transistor, wherein both of a drain-side metal and a source-side metal of the transistor have the wiring layout according to claim 1.

7. A semiconductor device, comprising:
a transistor, wherein one of a drain-side metal or a source-side metal of the transistor has the wiring layout according to claim 1.

8. The semiconductor device according to claim 1, wherein a number of multi-gates of the multi-gate transistor is 10 or more.

9. The semiconductor device according to claim 1, wherein a silicon on insulator (SOI) substrate is used for the multi-gate transistor.

10. The semiconductor device according to claim 1, wherein a compound semiconductor is used for the multi-gate transistor.

* * * * *